United States Patent
Vogt (10) Patent No.: US 7,366,931 B2
(45) Date of Patent: Apr. 29, 2008

(54) MEMORY MODULES THAT RECEIVE CLOCK INFORMATION AND ARE PLACED IN A LOW POWER STATE

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 422 days.

(21) Appl. No.: 11/027,237

(22) Filed: Dec. 30, 2004

(65) Prior Publication Data

US 2006/0149982 A1    Jul. 6, 2006

(51) Int. Cl.
G06F 1/26    (2006.01)
G06F 1/32    (2006.01)

(52) U.S. Cl. .................. 713/320; 713/300; 713/501
(58) Field of Classification Search ................ 713/300, 713/310, 320, 501; 365/227
See application file for complete search history.

(56) References Cited

U.S. PATENT DOCUMENTS

| | | | | |
|---|---|---|---|---|
| 5,319,601 | A * | 6/1994 | Kawata et al. ............... | 365/226 |
| 5,548,250 | A * | 8/1996 | Fang ........................... | 331/14 |
| 5,848,014 | A * | 12/1998 | Yukshing .................... | 365/227 |
| 6,073,223 | A * | 6/2000 | McAllister et al. .......... | 711/167 |
| 6,275,948 | B1 * | 8/2001 | Bays et al. .................. | 713/320 |
| 6,316,980 | B1 | 11/2001 | Vogt et al. ................... | 327/273 |
| 6,378,018 | B1 * | 4/2002 | Tsern et al. .................. | 710/313 |
| 6,457,095 | B1 * | 9/2002 | Volk ............................ | 711/105 |
| 6,584,032 | B2 * | 6/2003 | Fujioka et al. ............... | 365/227 |
| 6,622,214 | B1 | 9/2003 | Vogt et al. ................... | 711/141 |
| 6,622,227 | B2 | 9/2003 | Zumkehr et al. ........... | 711/167 |
| 6,657,634 | B1 * | 12/2003 | Sinclair et al. ............. | 345/534 |
| 6,836,824 | B1 * | 12/2004 | Mirov et al. ................. | 711/118 |
| 6,901,494 | B2 | 5/2005 | Zumkehr et al. ........... | 711/167 |
| 6,944,738 | B2 * | 9/2005 | Dong ........................... | 711/167 |
| 2002/0144165 | A1 * | 10/2002 | Wright et al. ............... | 713/320 |
| 2004/0090827 | A1 | 5/2004 | Dahlen et al. .............. | 365/200 |
| 2004/0093472 | A1 | 5/2004 | Dahlen et al. .............. | 711/158 |
| 2004/0246767 | A1 | 12/2004 | Vogt ............................ | 365/154 |
| 2004/0246785 | A1 | 12/2004 | Vogt ............................ | 365/199 |
| 2004/0246786 | A1 | 12/2004 | Vogt ............................ | 365/199 |
| 2004/0250024 | A1 | 12/2004 | Vogt ............................ | 711/131 |
| 2004/0250153 | A1 | 12/2004 | Vogt ............................ | 713/500 |
| 2004/0250181 | A1 | 12/2004 | Vogt et al. ................... | 714/718 |

(Continued)

OTHER PUBLICATIONS

U.S. Appl. No. 10/833,474, filed Jun. 30, 2004, Pete D. Vogt.

(Continued)

*Primary Examiner*—Thomas Lee
*Assistant Examiner*—Jaweed A Abbaszadeh
(74) *Attorney, Agent, or Firm*—Marger Johnson & McCollom, P.C.

(57) ABSTRACT

Embodiments described herein provide a power saving state for a memory system. For example, a memory system may derive clocking information from a training pattern sent over a memory channel. A memory may comprise a link to receive training frames, and circuitry to derive a clock from the training frames, and place the memory module in a low power state between training frames. Embodiments as described herein may utilize periodic training frames to implement a power saving state on the channel or the memory system, either in whole or in part.

22 Claims, 10 Drawing Sheets

U.S. PATENT DOCUMENTS

| | | | |
|---|---|---|---|
| 2004/0260991 A1 | 12/2004 | Vogt et al. | 714/738 |
| 2005/0071580 A1 | 3/2005 | LeClerg et al. | 711/154 |
| 2005/0108458 A1 | 5/2005 | Vogt | 711/1 |
| 2005/0108465 A1 | 5/2005 | Vogt | 711/100 |
| 2005/0108469 A1 | 5/2005 | Freeman et al. | 711/105 |
| 2005/0108490 A1 | 5/2005 | Vogt | 711/167 |
| 2005/0108611 A1 | 5/2005 | Vogt | 714/758 |
| 2005/0235130 A1* | 10/2005 | Barth et al. | 711/170 |
| 2005/0262388 A1 | 11/2005 | Dahlen et al. | 714/5 |
| 2005/0276150 A1 | 12/2005 | Vogt | 365/233 |
| 2006/0004953 A1 | 1/2006 | Vogt | 711/105 |
| 2006/0050822 A1 | 3/2006 | Panikkar et al. | 375/354 |
| 2006/0095703 A1* | 5/2006 | Ferraiolo et al. | 711/170 |

OTHER PUBLICATIONS

U.S. Appl. No. 11/173,641, filed Jun. 30, 2005, Swaminathan et al.
U.S. Appl. No. 10/859,060, filed May 31, 2004, Pete D. Vogt.
U.S. Appl. No. 11/027,237, filed Dec. 30, 2004, Pete D. Vogt.
U.S. Appl. No. 10/995,850, filed Nov. 22, 2004, Pete D. Vogt.
U.S. Appl. No. 11/027,291, filed Dec. 30, 2004, Pete D. Vogt.
U.S. Appl. No. 11/027,004, filed Dec. 30, 2004, Pete D. Vogt.
U.S. Appl. No. 10/996,760, filed Nov. 23, 2004, Leclerg et al.
U.S. Appl. No. 11/141,668, filed May 31, 2005, McCall et al.
U.S. Appl. No. 11/097,955, filed Mar. 31, 2005, Pete D. Vogt.
U.S. Appl. No. 11/165,595, filed Jun. 22, 2005, Pete D. Vogt.
U.S. Appl. No. 11/165,582, filed Jun. 22, 2005, Pete D. Vogt.
U.S. Appl. No. 11/205,645, filed Aug. 16, 2005, Rosenbluth et al.

* cited by examiner

MEMORY MODULES THAT RECEIVE CLOCK INFORMATION AND ARE PLACED IN A LOW POWER STATE

BACKGROUND

Figure 1:
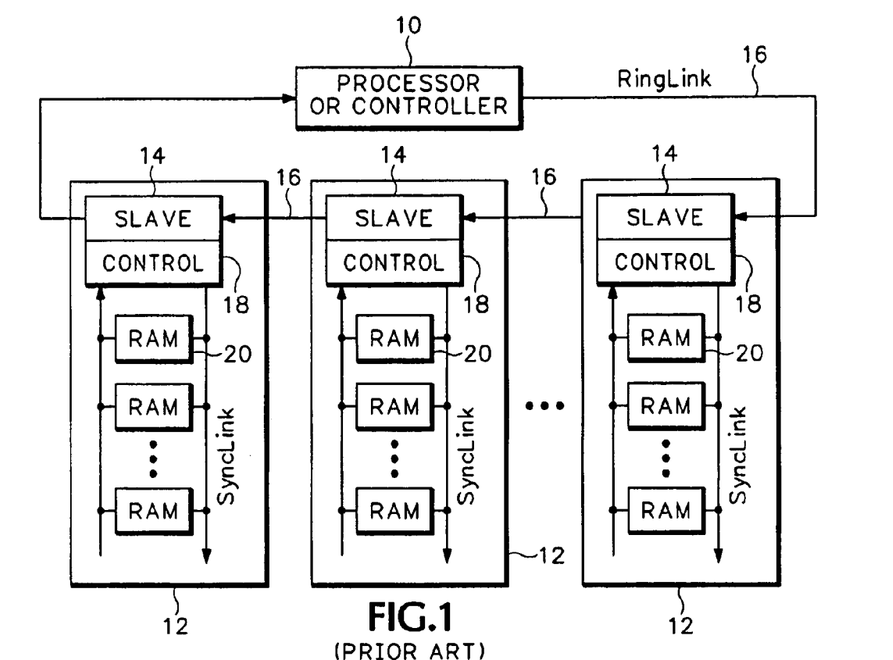
FIG. 1 illustrates a prior art RamLink memory system.

FIG. 1 illustrates a prior art memory system known informally as RamLink, which was proposed as a standard by the Institute of Electrical and Electronics Engineers (IEEE). The standard was designated as IEEE Std 1596.4-1996 and is known formally as *IEEE Standard for High-Bandwidth Memory Interface Based on Scalable Coherent Interface (SCI) Signaling Technology* (*RamLink*). The system of FIG. 1 includes a memory controller 10 and one or more memory modules 12. The memory controller 10 is typically either built into a processor or fabricated on a companion chipset for a processor. Each memory module 12 has a slave interface 14 that has one link input and one link output. The components are arranged in a RamLink signaling topology known as RingLink with unidirectional links 16 between components. A control interface 18 on each module interfaces the slave interface 14 with memory devices 20. In the system shown in FIG. 1, another RamLink signaling topology known as SyncLink is used between the slave interfaces and memory devices.

The purpose of the RamLink system is to provide a processor with high-speed access to the memory devices. Data is transferred between the memory controller and modules in packets that circulate along the RingLink. The controller is responsible for generating all request packets and scheduling the return of slave response packets.

A write transaction is initiated when the controller sends a request packet including command, address, time, and data to a particular module. The packet is passed from module to module until it reaches the intended slave, which then passes the data to one of the memory devices for storage. The slave then sends a response packet, which is passed from module to module until it reaches the controller to confirm that the write transaction was completed.

A read transaction is initiated when the controller sends a request packet including command, address, and time to a module. The slave on that module retrieves the requested data from one of the memory devices and returns it to the controller in a response packet, which is again passed from module to module until it reaches the controller.

Figure 2:
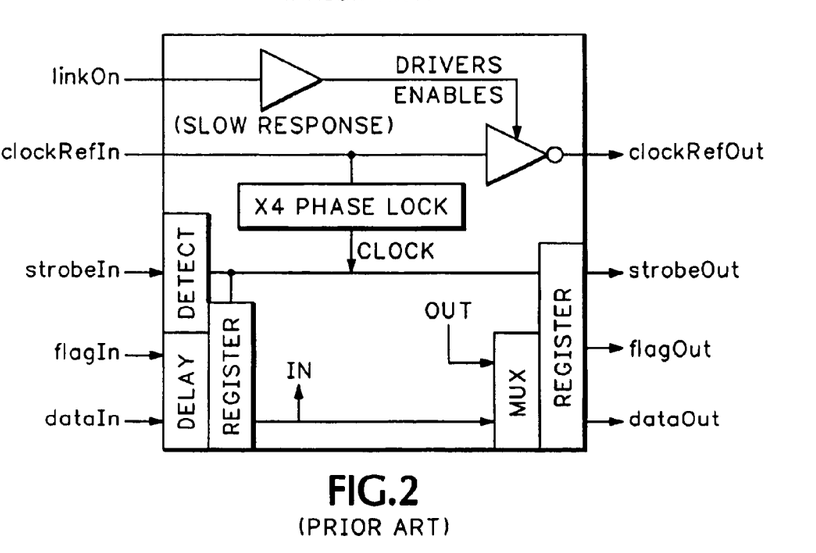
FIG. 2 illustrates a prior art RamLink slave interface circuit.

FIG. 2 illustrates a prior art RamLink slave interface circuit. In the circuit of FIG. 2, source-synchronous strobing is used to clock the incoming data signals. That is, a strobe signal, which accompanies the incoming data signals, is used to sample the incoming data. The circuit of FIG. 2 uses a phase-locked loop (PLL) to generate a stable local clock signal from a reference clock signal that is distributed to other slave interface circuits. The local clock signal is used to reclock the outgoing data signal so as to avoid cumulative jitter as the data is passed along downstream.

DETAILED DESCRIPTION

This patent encompasses numerous inventions that have independent utility. In some cases, additional benefits are realized when some of the principles are utilized in various combinations with one another, thus giving rise to additional inventions. These principles may be realized in myriad embodiments. Although some specific details are shown for purposes of illustrating embodiments of the invention, numerous other arrangements may be devised. Thus, the example embodiments do not limit the invention.

Figure 3:
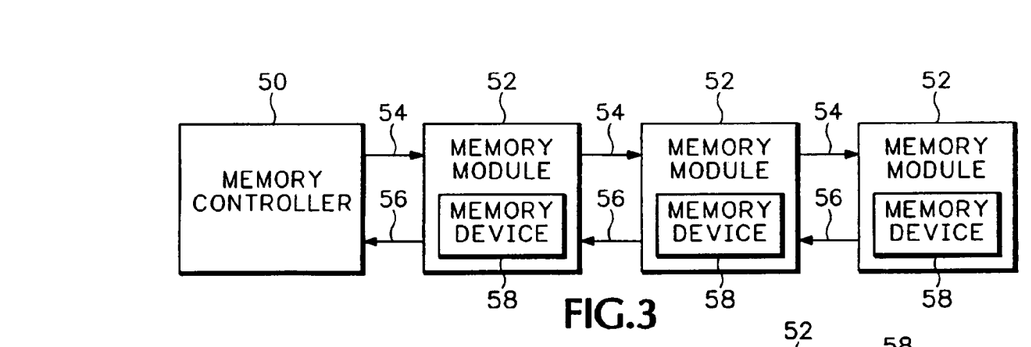
FIG. 3 illustrates a memory interface system.

FIG. 3 illustrates an embodiment of a memory interface system. The system of FIG. 3 includes a memory controller 50 and one or more memory modules 52 that communicate through a channel made up of unidirectional links. The channel has an outbound path that includes one or more outbound links 54, and an inbound path that includes one or more inbound links 56. Each module may be capable of redriving signals from link to link on the outbound path and from link to link on the inbound path. Each module may also be capable of selectively disabling any redrive features, for example, if the module detects that it is the outermost module, or responsive to a command from the memory controller.

Each module includes one or more memory devices 58 arranged to transfer data to and/or from one or more of the paths. For example, the module may be arranged such that data from the outbound path is transferred to a memory device, and data from the memory device is transferred to the inbound path. One or more buffers may be disposed between one or more memory devices and one or more of the paths. The modules and controller are not limited to any particular mechanical arrangement. For example, the modules may be fabricated on substrates separate from the rest of the system, they may be fabricated on a common substrate with the controller and links, or they may be realized in any other mechanical arrangement. The modules are also not limited to any particular type of memory device, e.g., read only memory (ROM), dynamic random access memory (DRAM), flash memory, etc.

Figure 4:
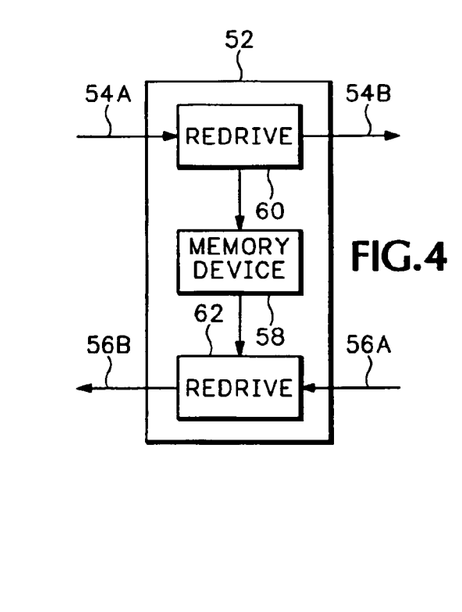
FIG. 4 illustrates memory module.

FIG. 4 illustrates an embodiment memory module. The module of FIG. 4 includes two redrive circuits 60 and 62 to receive signals on unidirectional links 54A and 56A, and redrive the signals on unidirectional links 54B and 56B, respectively. One or more memory devices 58 are arranged to transfer data to and/or from one or more of the redrive circuits.

The module of FIG. 4 is not limited to any particular arrangement of unidirectional links or any particular arrangement for transferring data to and/or from the redrive circuits. If the module of FIG. 4 is to be used in a memory system such as that shown in FIG. 3, then redrive circuit 60 might be designated as an outbound redrive circuit and arranged to receive and redrive signals on an outbound path including links 54A and 54B, and the other redrive circuit 62 might be designated as an inbound redrive circuit and arranged to receive and redrive signals on an inbound path including links 56A and 56B. In this example, one or more memory devices 58 may be arranged so that data is transferred from the outbound redrive circuit 60 to the memory device(s) and from the memory device(s) to the inbound redrive circuit 62.

The module may be capable of detecting if it is the outermost module on a channel and selectively disabling any redrive features accordingly. For example, if the module of FIG. 4 is to be used in a memory system such as that shown in FIG. 3, and the module detects that it is the outermost module, the outbound redrive circuit may receive incoming signals on link 54A and not redrive them. Likewise, the inbound redrive circuit only drives link 56B with signals corresponding to data received from the memory device(s), and/or other signals that may be generated internally by the module. Alternatively, even if the module detects that it is not the outermost module, it may be constructed so that it is capable of operating as though it is the outermost module (for example, in response to a command from a memory controller), in which case it may ignore signals received on inbound link 56A, and it may not redrive signals onto outbound link 54B.

Figure 5:
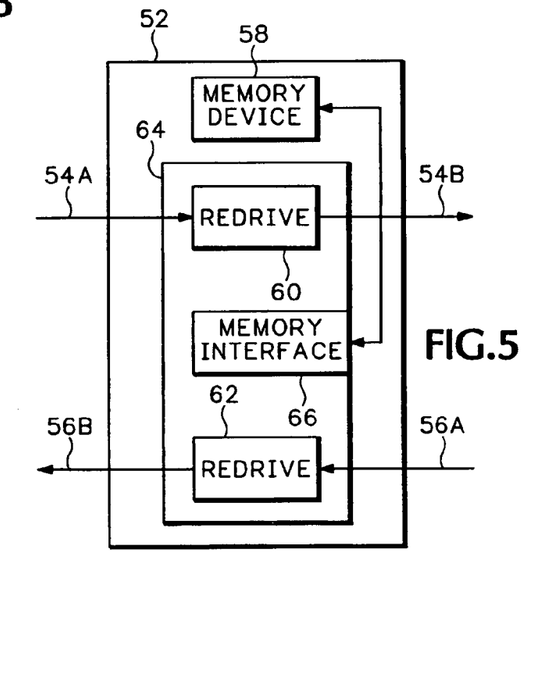
FIG. 5 illustrates another memory module and memory buffer.

FIG. 5 illustrates another embodiment memory module and an embodiment memory buffer. The module of FIG. 5 includes a memory buffer 64 having two redrive circuits 60 and 62 to receive signals on unidirectional links 54A and 56A, and redrive the signals on unidirectional links 54B and 56B, respectively. The memory buffer also includes a memory interface 66 arranged to transfer data to and from one or more memory devices 58. The buffer may be capable of detecting if it is the last agent on a channel and selectively disabling any redrive features accordingly. The buffer may be capable of operating as though it is the last agent on a channel, even if it is not, for example, responsive to a command from a memory controller. As used herein, agent refers to any memory controller (also called a host), module, buffer, etc. that is interfaced to the channel.

The module and buffer of FIG. 5 are not limited to any particular arrangement of unidirectional links or any particular arrangement for transferring between the memory interface and the redrive circuits. If the module of FIG. 5 is to be used in a memory system such as that shown in FIG. 3, then redrive circuit 60 might be designated as an outbound redrive circuit and arranged to receive and redrive signals on an outbound path including links 54A and 54B, and the other redrive circuit 62 might be designated as an inbound redrive circuit and arranged to receive and redrive signals on an inbound path including links 56A and 56B. In this example, the memory interface may be configured to receive data from the outbound redrive circuit 60 and to send data to the inbound redrive circuit 62.

Various mechanical arrangements may be used to implement the memory modules and/or buffer of FIGS. 4 and 5. For example, the memory devices 58, redrive circuits 60 and 62, and buffer 64 may all be realized as separate integrated circuits mounted on a common circuit board or on separate circuit boards. Various combinations of the components may be fabricated together on a common integrated circuit, or they all might be fabricated on a single integrated circuit. The circuit board or boards, if any, may be capable of being plugged into sockets on a motherboard, fabricated integral with a motherboard, or arranged in any other way. There may not be a circuit board, for example, if the components are fabricated as part of a multi-chip module. A memory buffer may be used to interface devices other than memory devices to a channel. For example a memory buffer may be used to interface an I/O controller or a bridge to a channel.

Additional embodiments are described with reference to "inbound" and "outbound" paths, links, redrive circuits, etc. to facilitate an understanding of how the apparatus may be utilized in a memory system such as the embodiment shown in FIG. 3. These apparatus, however, are not limited to any particular arrangement of unidirectional links, to the particular arrangements shown for transferring data between the links and other circuitry, or to any of the implementation details shown.

Figure 6:
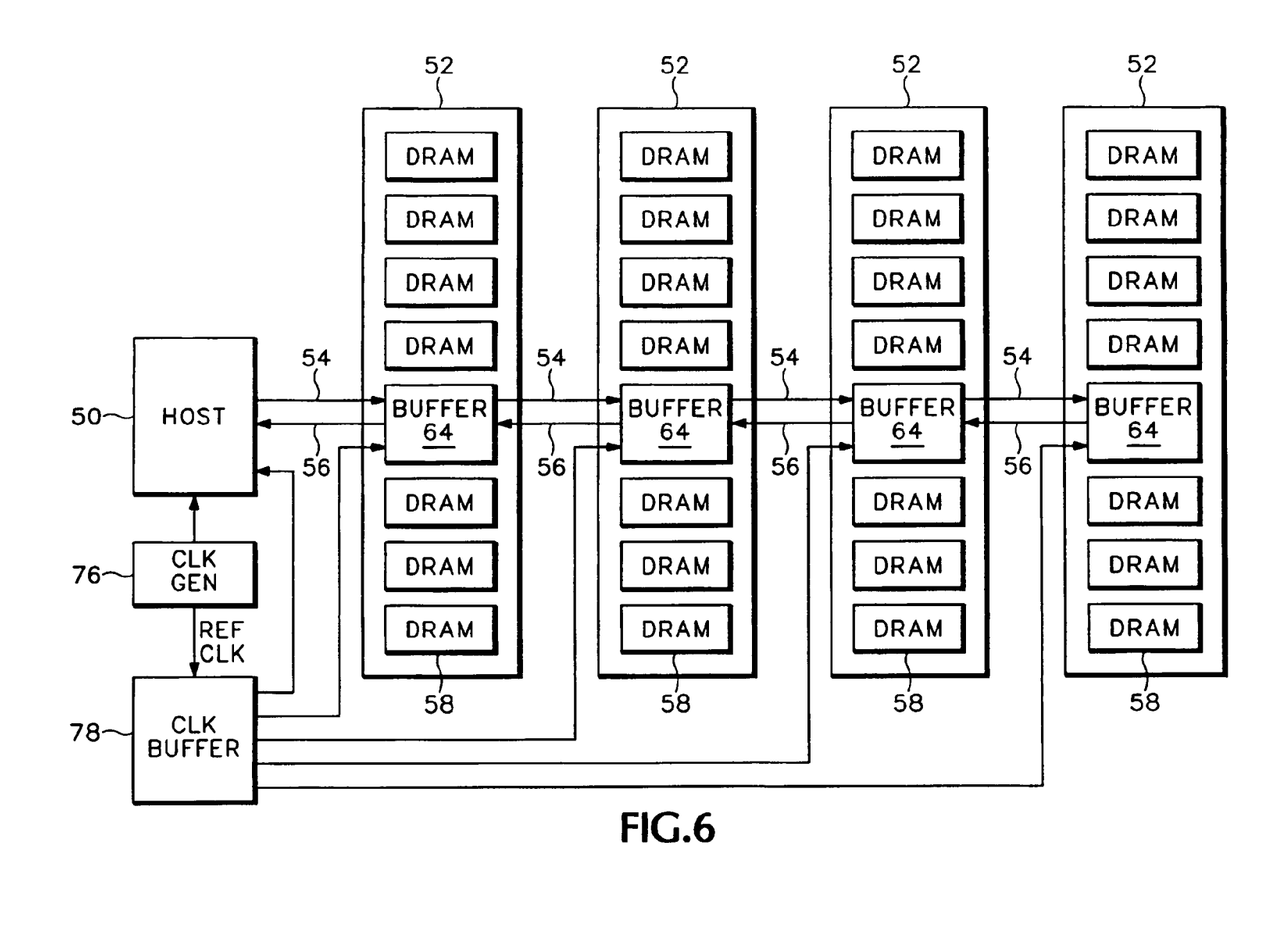
FIG. 6 illustrates additional memory systems, memory modules, and memory buffers.

FIG. 6 illustrates additional example embodiments of a memory system, memory modules, and memory buffers. Referring to FIG. 6, one or more memory modules 52 are based on printed circuit boards having contact fingers along both sides of one edge to create a dual inline memory module (DIMM) that may be plugged into a connector on another circuit board that holds other components of the system. An existing form-factor may be adopted for the module, for example the DIMM form-factor used for Double Data Rate II (DDR2) dynamic random access memory (DRAM) modules.

The modules are populated with memory devices 58, for example, commodity-type DRAM such as DDR2 DRAM. A memory buffer 64 on each module isolates the memory devices from a channel that interfaces the modules to the memory controller 50, which is also referred to as a host. The channel is wired in a point-to-point arrangement with an outbound path that includes outbound links 54, and an inbound path that includes inbound links 56. The links may be implemented with parallel unidirectional bit lanes using low-voltage differential signals.

In the embodiments of FIG. 6, no additional signal lines are used for functions such as command, reset, initialization, and the like. Instead, these functions are encoded directly in the data sent over the channel. Alternatively, however, any number of additional signal lines may be used to implement such functions.

A reference clock signal REF CLK is generated by a clock synthesizer 76 distributed to the host and modules, maybe through a clock buffer 78. This facilitates a quasi-asynchronous clocking scheme in which locally generated clock signals are used to sample and redrive incoming data. Because a common reference clock is available at each agent, data signals may be clocked without any frequency tracking. Alternatively, a local clock signal may be generated independently of any reference clock. As another alternative, a synchronous clocking scheme such as source synchronous strobing may be used.

In one possible embodiment, the host initiates data transfers by sending data, maybe in packets or frames (terms used interchangeably here), to the innermost module on the outbound path. The innermost module receives and redrives the data to the next module on the outbound path. Each module receives and redrives the outbound data until it reaches the outermost module. Although the outermost module could attempt to redrive the data to a "nonexistent" outbound link, each module may be capable of detecting (or being instructed) that it is the outermost module and disabling any redrive circuitry to reduce unnecessary power consumption, noise, etc. In this embodiment, data transfers in the direction of the host, i.e., inbound, are initiated by the outermost module. Each module receives and redrives inbound data along the inbound path until it reaches the host.

Any suitable communication protocol may be used over the physical channel. For example, the host may be designated to initiate and schedule all inbound and outbound data transfers. Alternatively, any agent may be allowed to initiate data transfers. Frames of data may be configured to carry commands, read data, write data, status information, error information, initialization data, idle patterns, etc., or any combination thereof. A protocol may be implemented such that, when the host sends a command frame to a target module along the outbound path, the target module responds by immediately sending a response frame back to the host along the inbound path. In such an embodiment, the target module does not redrive the command frame on the outbound path.

In an alternative embodiment, the target module receives the command frame and then redrives the command frame on the outbound path. When the outermost module receives the command frame, it initiates a response frame (maybe nothing more than an idle frame) on the inbound path. The target module waits until the response frame reaches its inbound receiver. The target module then mergers its response into the inbound data stream, e.g., by replacing the response frame sent by the outermost module with the target module's true response frame.

Figure 7:
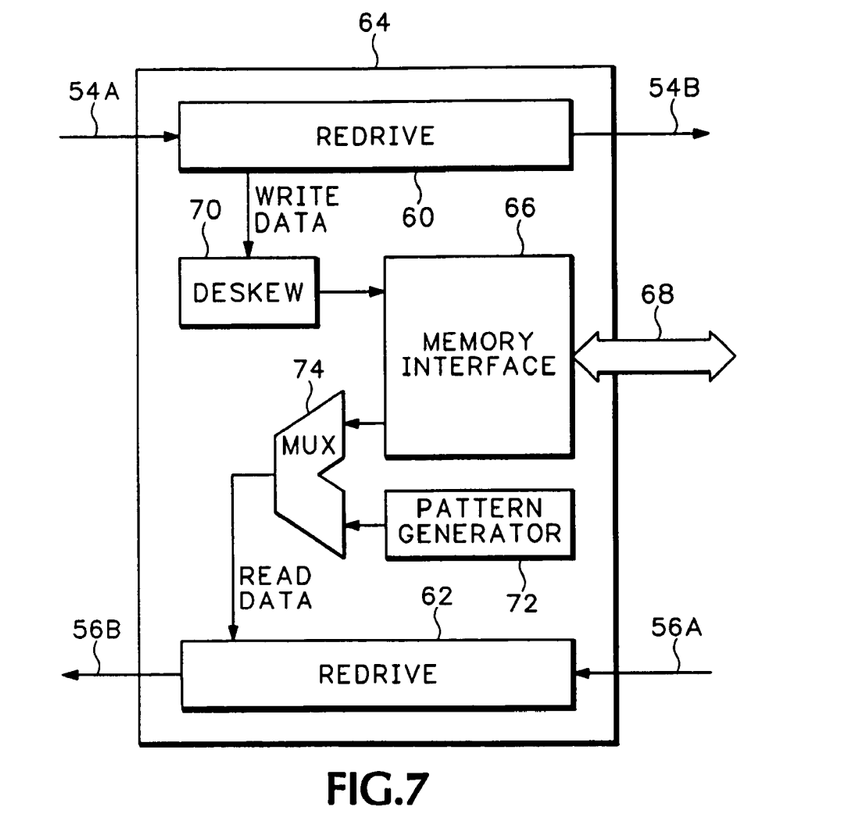
FIG. 7 illustrates another example memory buffer.

FIG. 7 illustrates another example embodiment of a memory buffer. The memory buffer of FIG. 7 includes an outbound redrive circuit 60 to receive and redrive signals on an outbound path including links 54A and 54B, and an inbound redrive circuit 62 to receive and redrive signals on an inbound path including links 56A and 56B. A memory interface 66 interfaces the buffer to one or more memory devices, which may be through a memory bus 68. The memory interface may include read and/or write buffers such as FIFO buffers. Data from the outbound path is coupled to the memory interface, which may be through a deskew circuit 70 which eliminates skew between bits of data if the outbound path has more than one bit lane. A pattern generator 72 may be used to generate status patterns to transmit onto the inbound path, for example, if the buffer happens to be the outermost agent on a channel, in which case, there may be no signals being received on incoming inbound link 56A. A multiplexer 74 selectively couples data from the memory interface or pattern generator to the inbound redrive circuit.

The memory interface is not limited to any particular arrangement, and it may be compatible with standard memory devices, particularly commodity memory devices such as DDR2 DRAM. The entire memory buffer may be integrated on a single integrated circuit, it may be integrated into one or more memory devices, its constituent elements may be integrated onto separate components, or any other mechanical arrangement may be employed. The embodiment shown in FIG. 7 is exemplary only, other embodiments are possible. For example, the embodiment of FIG. 7 is shown with unidirectional data flowing from the outbound redrive circuit to the memory interface and from the memory interface to the inbound redrive circuit. This data flow, however, may be bi-directional, and other arrangements are contemplated. Even if the embodiment of FIG. 7 is to be used in a channel system in which data for the memory interface only needs to flow as shown in FIG. 7, it may still be realized with redrive circuits having full bi-directional data access as this may facilitate, for example, implementation of built-in self-test (BIST) functions, in which case a second deskew circuit for deskewing data from the inbound path may be helpful.

Figure 8:
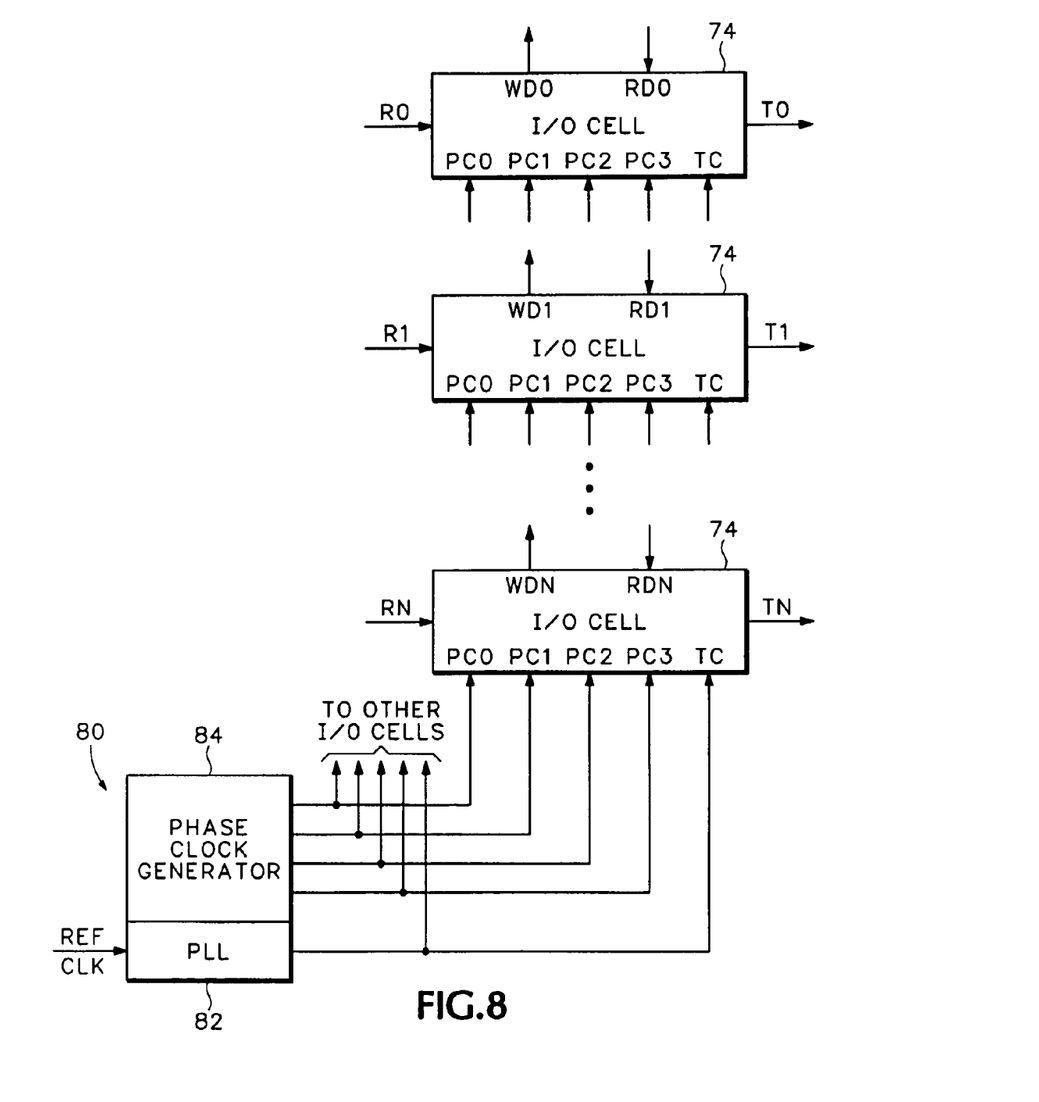
FIG. 8 illustrates a redrive circuit.

FIG. 8 illustrates an embodiment of a redrive circuit. The circuit of FIG. 8 includes one or more input/output (I/O) cells 74, each of which receives an input data signal RX that it may redrive as an output data signal TX. Alternatively, an I/O cell may substitute or merge a read data signal RDX into the output data signal. A write data signal WDX may be taken from the input data signal, either before or after it is redriven as the output data signal.

The "X" in any of the above signal names indicates that it might be one of multiple similar signals depending on the number of I/O cells in the redrive circuit. For example, a redrive circuit having nine bit lanes would have nine I/O cells with input data signals named R0, R1 . . . R8. In a redrive circuit with only a single I/O cell, the data input signal would be R0 or simply R. The term RX is used to refer generically to any or all of the input data signals.

The term "write data" is used for convenience to indicate any data being taken from the data stream traveling through the I/O cell. This does not imply, however, that write data must be directed to a memory interface or memory device. Likewise, "read data" refers to any data that is input to the I/O cell, but read data may come from any source, not just a memory device or memory interface.

Referring again to FIG. 8, a clock generator 80 generates a number of phase clock signals PCX and a transmit clock signal TC in response to a reference clock signal REF CLK. The clock generator includes a phase locked loop (PLL) 82 that generates the transmit clock TC as a multiple of the reference clock signal REF CLK, and a phase clock generator 84. In one possible embodiment, there are four phase clock signals PC0, PC1, PC2 and PC3 spaced 90 degrees apart and derived from the transmit clock TC. Each of the I/O cells may use one or more of the TC and PCX clock signals to sample and/or redrive data signals, and/or to generate additional local clock signals. In this embodiment, the phase clock and transmit clock signals are stable signals in the sense that they are not adjusted in response to the phase of any of the input data signals RX.

Figure 9:
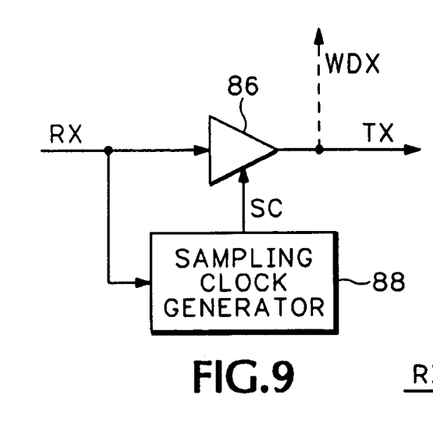
FIG. 9 illustrates an I/O cell.

FIG. 9 illustrates an embodiment of an I/O cell. A receiver 86 is arranged to receive a data signal RX and redrive it as data signal TX in response to a sampling clock signal SC. The sampling clock signal is generated by a sampling clock generator 88, which is capable of adjusting the sampling clock signal in response to the data signal RX. A write data signal WDX may be taken from the input or the output of receiver 86. If taken from the output of the receiver as shown in FIG. 9, the sampling clock signal SC may be used as, or to derive, a strobe signal for the write data. The input to the sampling clock generator may be taken from points other than the input of the receiver as shown in FIG. 9. For example, it may be taken from the output of the receiver as well.

Figure 10:
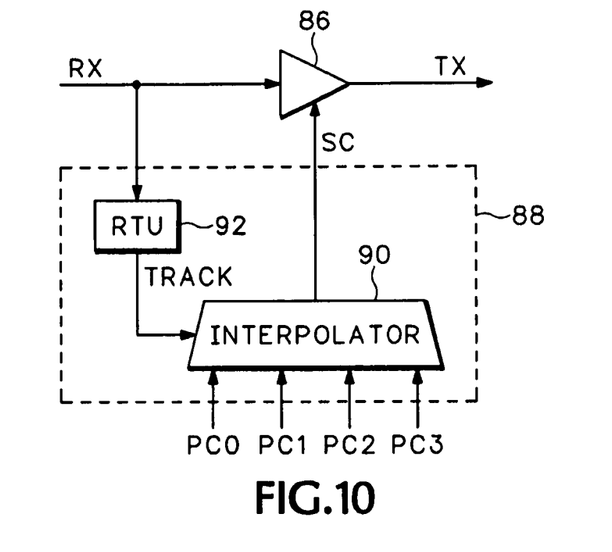
FIG. 10 illustrates an I/O cell.

FIG. 10 illustrates another embodiment of an I/O cell. In the embodiment of FIG. 10, the sampling clock generator 88 is implemented with an interpolator 90 and a receiver tracking unit (RTU) 92. The interpolator generates the sampling clock signal by interpolating between a number of phase clock signals PCX (in this case four signals that are 90 degrees out of phase) in response to a tracking signal from the receiver tracking unit. The receiver tracking unit observes the data signal RX and adjusts the tracking signal so that the sampling clock signal causes the receiver to sample and redrive the data signal at an appropriate time. Thus, the sampling clock signal may dynamically track the data signal.

In one possible embodiment, the receiver tracking unit observes transitions in the data signal RX by over sampling the data signal and adjusting the sampling clock signal to sample and redrive the data signal at the center of the data eye, i.e., at the midway point between transitions in the data signal. The sampling clock generator 88 may include a loop filter that measures several bit cells and may eventually determine that it should adjust the phase of the sampling clock signal to capture the data closer to the center of the data eye location. The input to the sampling clock generator may be taken from points other than the input of the receiver as shown in FIG. 10. For example, it may be taken from the output of the receiver as well.

An embodiment of an I/O cell may be used with a scheme that trains the I/O cells to dynamically track the data signal. For example, if the I/O cell of FIG. 10 is used as one of the memory modules shown in FIG. 3, the host may periodically send training frames onto the outbound path. These training frames have an edge density that is adequate to assure that the receiver tracking unit observes enough transitions in the data signal to be able to adjust the sampling clock signal. Likewise, the outermost module in FIG. 3 may periodically send training frames onto the inbound path.

Figure 11:
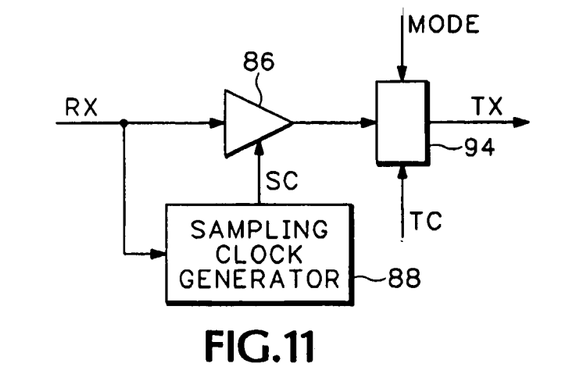
FIG. 11 illustrates an I/O cell.

FIG. 11 illustrates another embodiment of an I/O cell. The embodiment of FIG. 11 is similar to that of FIG. 9, but a buffer 94 is added in the data signal path. The buffer 94 may be a jitter avoidance or drift compensation buffer that compensates for voltage and temperature induced effects. The buffer resynchronizes the data signal TX to a transmit clock signal TC. The transmit clock signal is stable in the sense that its phase is not adjusted in response to the data signal the way the sample clock signal SC is.

In the embodiment of FIG. 11, the buffer is capable of operating in either a pass-through mode, or a redrive mode in response to a mode signal. In pass-through mode, the signal passes through without being sampled and redriven. In redrive mode, the signal is sampled and redriven in response to the clock signal. This enables the I/O cell to operate in different redrive modes. In one possible embodiment, the buffer operates in pass through mode if the mode signal is asserted. This is referred to as resample mode and may result in a shorter latency because the data signal is being redriven by the same clock that is used to sample the data. When the mode signal is not asserted, the buffer operates in redrive mode, so the data is resynchronized to the transmit clock. This is referred to as resync mode and may result in a longer latency but may reduce jitter. The I/O cell may be designed into a memory buffer or module that has an input for receiving the mode signal. If the memory buffer or module is to be used on a system in which there is a relatively short signal path to the next agent, the input may be asserted (or not asserted depending on polarity) to cause the I/O cell to operate in resample mode because more jitter may be tolerated on a short signal path. On the other hand, if the memory buffer or module is to be used on a system in which there is a relatively long signal path to the next agent, the input may be de-asserted to cause the I/O cell to operate in resync mode because this reduces jitter, albeit at the possible expense of longer latency. Alternatively, a registered flag may be used on the memory buffer or module, or in a redrive circuit, or in the I/O cell itself to control the mode signal.

Figure 12:
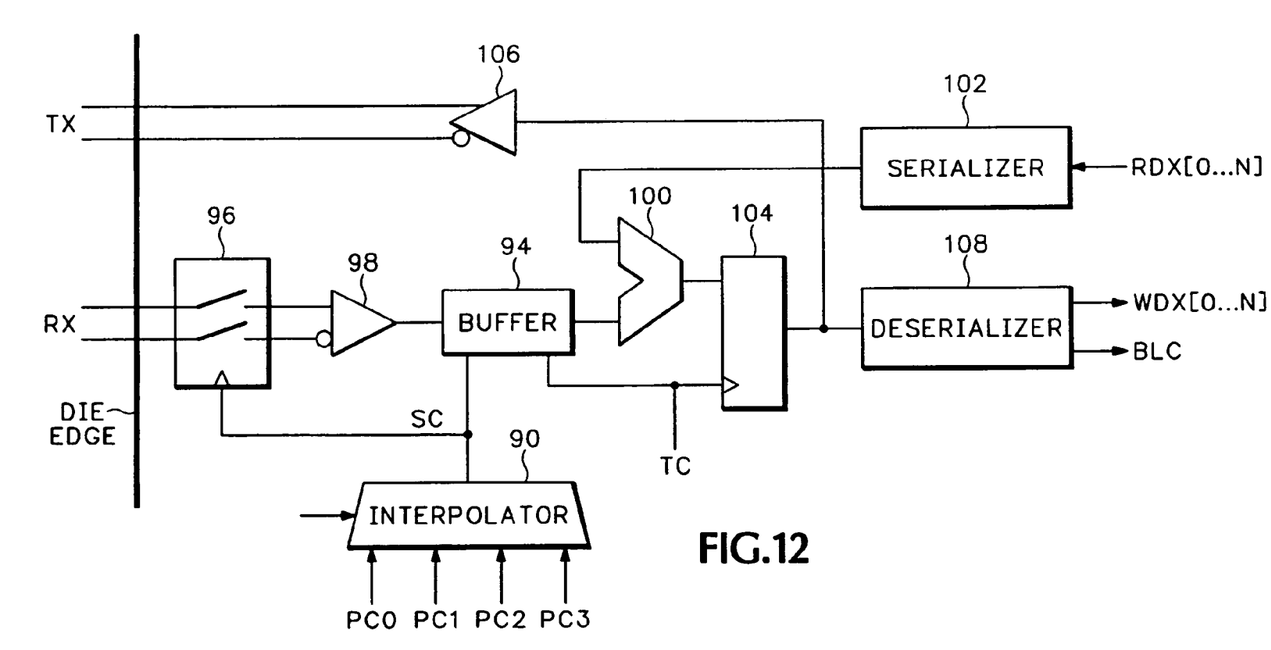
FIG. 12 illustrates an I/O cell.

FIG. 12 illustrates another embodiment of an I/O cell. In the embodiment of FIG. 12, the received and transmitted data signals RX and TX are differential signals and are shown traversing the edge of an integrated circuit die on which the I/O cell may be fabricated. The receiver 86 includes a sampling unit 96 and a termination unit 98. The sampling unit samples the incoming data signal in response to a sampling clock signal SC which is generated by interpolator 90 in response to phase clock signals from the sampling clock generator. The termination unit provides differential termination and converts the differential data signal into a single-ended signal. A jitter avoidance or drift compensation buffer 94 clocks data in response to either the sampling clock signal SC or a stable transmit clock signal TC. A multiplexer 100 selectively couples data signals from either the buffer 94 or a serializer 102 to a transmit latch 104. Read data signals RDX[0 . . . n] are received at the I/O cell at serializer 102. Another multiplexer may be disposed between buffer 94 and transmit latch 104 with one input connected to the buffer and another input connected to an output of the interpolator.

When the I/O cell needs to merge read data into the data stream, the multiplexer selects its input that is coupled to the serializer so that the transmit latch clocks the read data out of the I/O cell in response to the transmit clock signal TC. Otherwise, the multiplexer selects the data signal from the buffer which is then redriven by the transmit latch. The transmit data signal is converted back to a differential signal by transmitter 106 before being driven onto the next unidirectional link. Write data is taken from the output of the transmit latch, collected in a deserializer 108, and then routed to a deskew circuit, bit lane fail-over mechanism, or other circuitry. The deserializer may also provide a bit line clock signal BLC, which may be derived from the sample clock signal, to indicate when the write data WDX[0 . . . n] is valid.

Some embodiments relate to deskewing signals separately from redrive paths. A redrive path is defined by one or more components through which a signal propagates as it is received and redriven. For example, in the embodiments of FIGS. 9 and 10, the redrive path includes receiver 86. In the embodiment of FIG. 11, the redrive path includes receiver 86 and buffer 94. In the embodiment of FIG. 12, the redrive path includes sampling unit 96, termination unit 98, buffer 94, multiplexer 100, transmit latch 104, and transmitter 106.

According to some embodiments, a deskew circuit may be integrated into a redrive circuit such that the individual bit lanes of the deskew circuit are included in the redrive paths. Thus, the signals on the bit lanes may be deskewed in each redrive circuit as it is redriven along a path. Alternatively, however, an embodiment deskew circuit may be separate from the redrive paths. For example, in the embodiment of FIG. 7, a deskew circuit is shown separate not only from the redrive paths in redrive circuit 60, but also from the entire redrive circuit. Alternatively, an embodiment deskew circuit may be integrated into the redrive circuit, but still be separate from the redrive paths. For example, in the embodiment of FIG. 12, one or more deskew latches may be located at the output of serializer 102 and/or the input of deserializer 108.

The embodiments of methods and apparatus for deskewing signals separately from redrive paths as described above are exemplary only and are not limited to these specific examples. For example, just as the embodiments of redrive circuits illustrated in FIGS. 9-12 are not limited to use in memory systems having separate outbound and inbound paths, so too may the principles relating to deskewing signals separately from redrive paths according to this patent may be used with other types of memory architectures utilizing unidirectional links, e.g., an architecture that utilizes a ring-type arrangement of links such as RamLink.

Some embodiments relate to coping with failed bit lanes. For example, any of the unidirectional links between any of the agents shown in the embodiments of FIGS. 3, 4, 5, 6 or 7 may have more than one bit lane. According to an embodiment, one or more signals may be redirected on the bit lanes to avoid a bad bit lane. Any agent such as a memory controller (host), module, buffer, etc. may be capable of redirecting one or more signals on a number of bit lanes. A signal may be redirected at either or both ends of a link. Any agent may be capable of detecting a failed bit lane either automatically or with assistance from another agent, and any agent may be capable of redirecting signals responsive to a command from another agent.

Some embodiments may relate to permuting status patterns. In memory systems such as those described above with reference to FIGS. 1 and 3 where memory read and write data is transferred between memory agents, it may also be useful to send status information such as idle patterns, alert patterns, and other status information between memory agents. This may be accomplished by sending data patterns and status patterns on the same link or links that connect the memory agents. According to an embodiment, the status patterns may be permuted over time.

For example, referring to FIG. 3, the memory controller 50 may send frames having data patterns such as read commands to one or more of the modules 52 which respond by sending frames having data patterns such as read data back to the controller. It may be useful for the one or more of the modules to send a frame having an idle pattern back to the memory controller, for example, if the module was not able to retrieve read data from a memory device 58 fast enough. A predetermined data pattern may be designated as an idle pattern so that, if the memory controller receives the idle pattern, it knows it is not receiving read data. This may cause problems, however, if the actual read data pattern happens to match the designated idle pattern.

Figure 13:
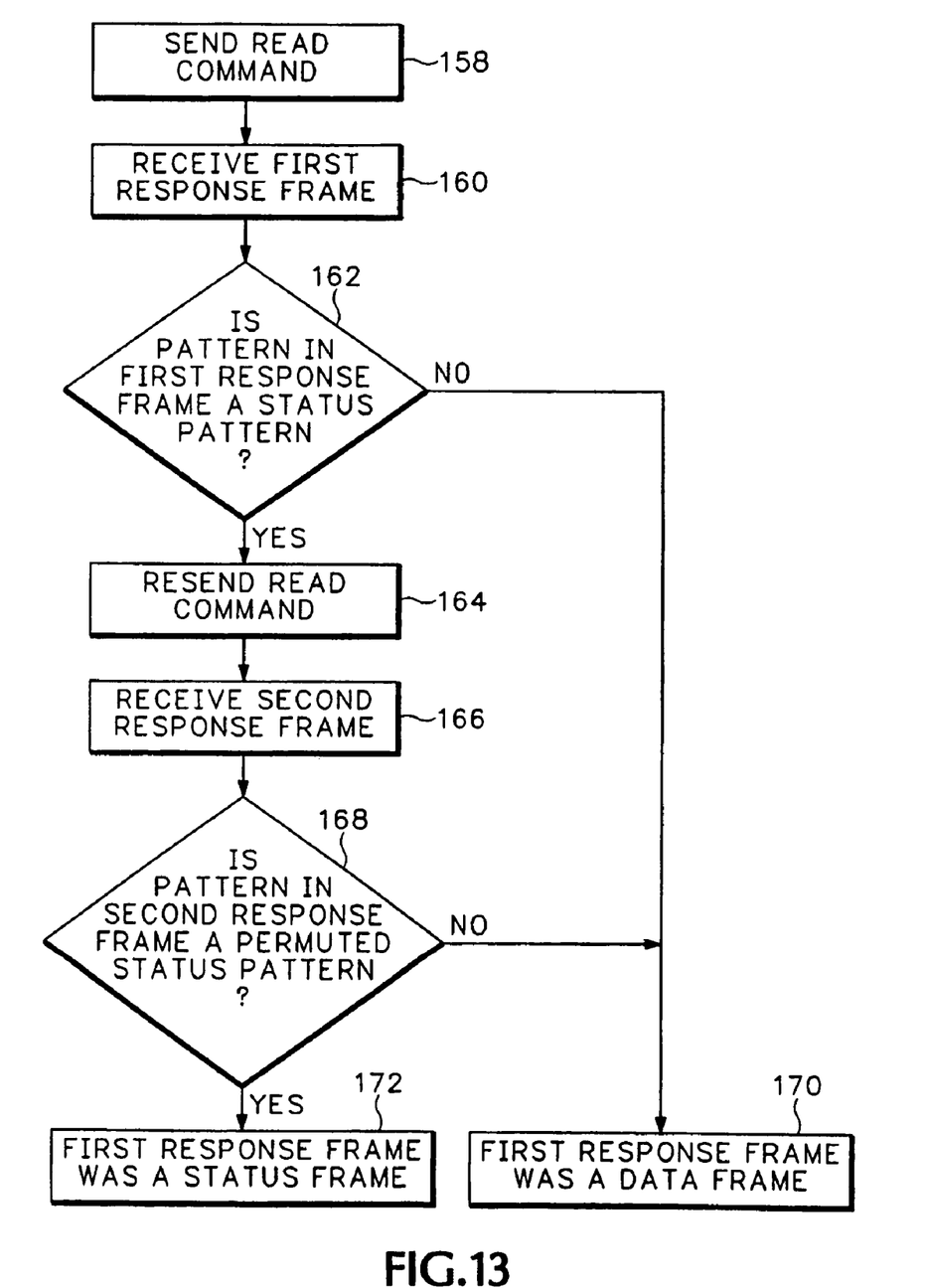
FIG. 13 illustrates a method for implementing permuting status patterns.

According to an embodiment, the memory controller and one or more modules may both be capable of permuting the idle pattern in a predictable manner so that the idle pattern changes over time. For example, the memory controller and modules may change the idle pattern according to a predetermined sequence each time an idle frame is sent and/or received. An embodiment of such a method is illustrated in FIG. 13. Thus, if the memory controller sends a read command frame (158) and receives a response frame (160) having the current idle pattern (162), it may resend the same read command (164). If the second response frame (166) contains the same pattern as the first (168), it interprets the pattern as actual read data (170). If, however, the pattern in the second response frame matches the permuted idle pattern (168), the memory controller knows that the first response frame was an idle frame (172).

According to an embodiment, the status information sent in status patterns may be idle patterns, alert patterns, and other status information such as command error information from a module, thermal overload information from a module, and information that indicates that a module has detected the presence of another module on the outbound path of memory channel. Some types of status patterns may be implemented as complementary patterns. For example, an alert pattern (which may be used to notify an agent of an error condition) may be implemented as the logical complement of an idle pattern. This may simplify the implementation by, for example, allowing a memory agent to use the same pattern generator for idle and alert patters. The use of complementary status patterns may be beneficial even if permuting patterns are not used.

A memory agent according to an embodiment may also be capable of intentionally generating an error such as a cyclical redundancy check (CRC) error in a status pattern. Such a technique may be useful as an alternative or supplemental way to distinguish a data pattern from a status pattern. For example, in some memory systems, each frame is sent along with a CRC code that used to check the integrity of the data in the frame.

According to an embodiment, a memory agent may intentionally send the wrong CRC code with frame that contains a status pattern. The receiving agent may then interpret the frame as a status frame rather than a data frame. Some memory systems may utilize a path or paths having an extra bit lane to carry CRC data. If such a system is capable of operating in a fail-over mode, the agent or agents may only utilize an intentional CRC error if not operating in fail-over mode. As used herein, the term CRC refers not only to a cyclical redundancy check, but also to any other type of error checking scheme used to verify the integrity of a frame or pattern.

Although the principles of status pattern permuting and handling are applicable to any type of memory agent, some additional aspects will be described with respect to a memory buffer such as the embodiment shown in FIG. 7 and in the context of a system such as the embodiment shown in FIG. 6. Referring to FIG. 6, if the memory buffer 64 is the outermost agent on a memory channel, it may be capable of constantly transmitting permuting idle status frames on the inbound link 56B whenever it is not sending data that the host has requested from any memory devices attached to the memory interface 66.

Embodiments of the invention may provide a power saving state for a memory system. For example, a memory system may derive clocking information from a training pattern sent over a memory channel. Communication on the channel may be in frames of data that are sent on the channel in either direction, from a memory controller to DIMMs and from the DIMMs to the memory controller. Embodiments as described herein may utilize periodic training frames to implement a power saving state on the channel or the memory system, either in whole or in part.

Numerous memory controller throttling techniques may be employed to reduce memory activity. For example, memory activity may be throttled to reduce power dissipation on DIMMs when memory system activity increases or when operating temperatures of the system increase. During these periods of reduced DIMM activity the power dissipated by the memory subsystem may be reduced.

For example, a Fully Buffered DIMM (FBD) may use periodic training of a data channel to keep data recovery circuits locked on a data stream. To accomplish this training, a minimum number of bit transitions per training period are required. A FBD protocol may require training frames every 42 frames, such as Sync training frames in a southbound direction and Status training frames in a northbound direction, where southbound is a link outbound from a memory controller to a memory device and northbound is an inbound link from a memory device to a memory controller. Some embodiments implement a low power state on a memory channel to minimize power between these training frames. In an embodiment, any timer or timing mechanism may be used to control duration of the powered down state, for example, for the powered down state to fit between training frames.

An embodiment may include a memory module comprising a link to receive training frames, and circuitry to derive a clock from the training frames and to place the memory module in a low power state between training frames. An embodiment may further include the module being placed in a low power state in response to a signal received on the link.

In an embodiment, the memory module may further include a timer, and the memory module may remain in the low power state for the duration of the timer. In an embodiment, the timer duration may allow the circuitry to continue deriving a clock from the training frames. And in an embodiment, the memory module may power down at least one of a transmit and a receive circuitry during the low power state.

Figure 14:
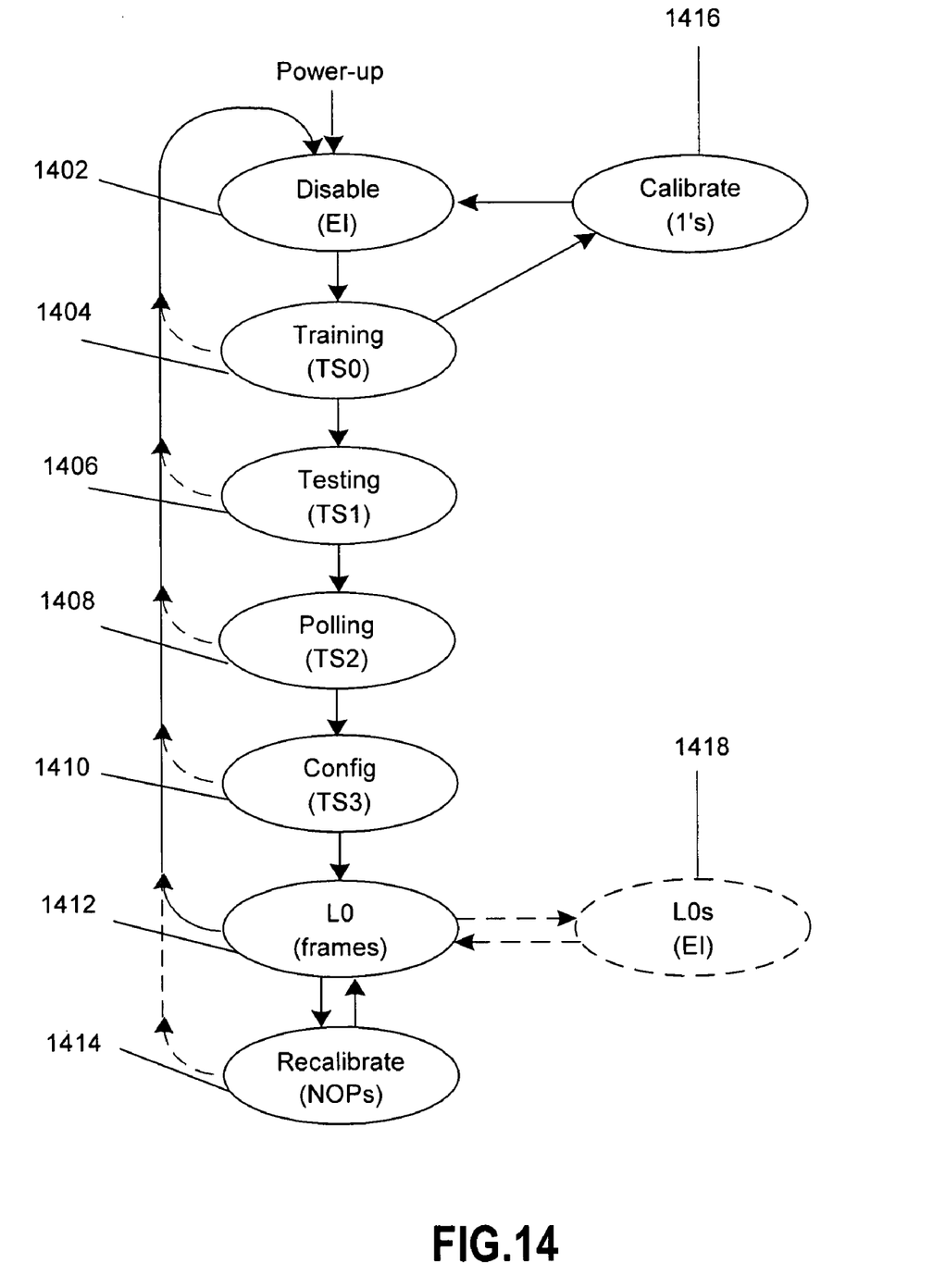
FIG. 14 illustrates an example initialization flow diagram for a memory device according to an embodiment of the invention.
Figure 15:
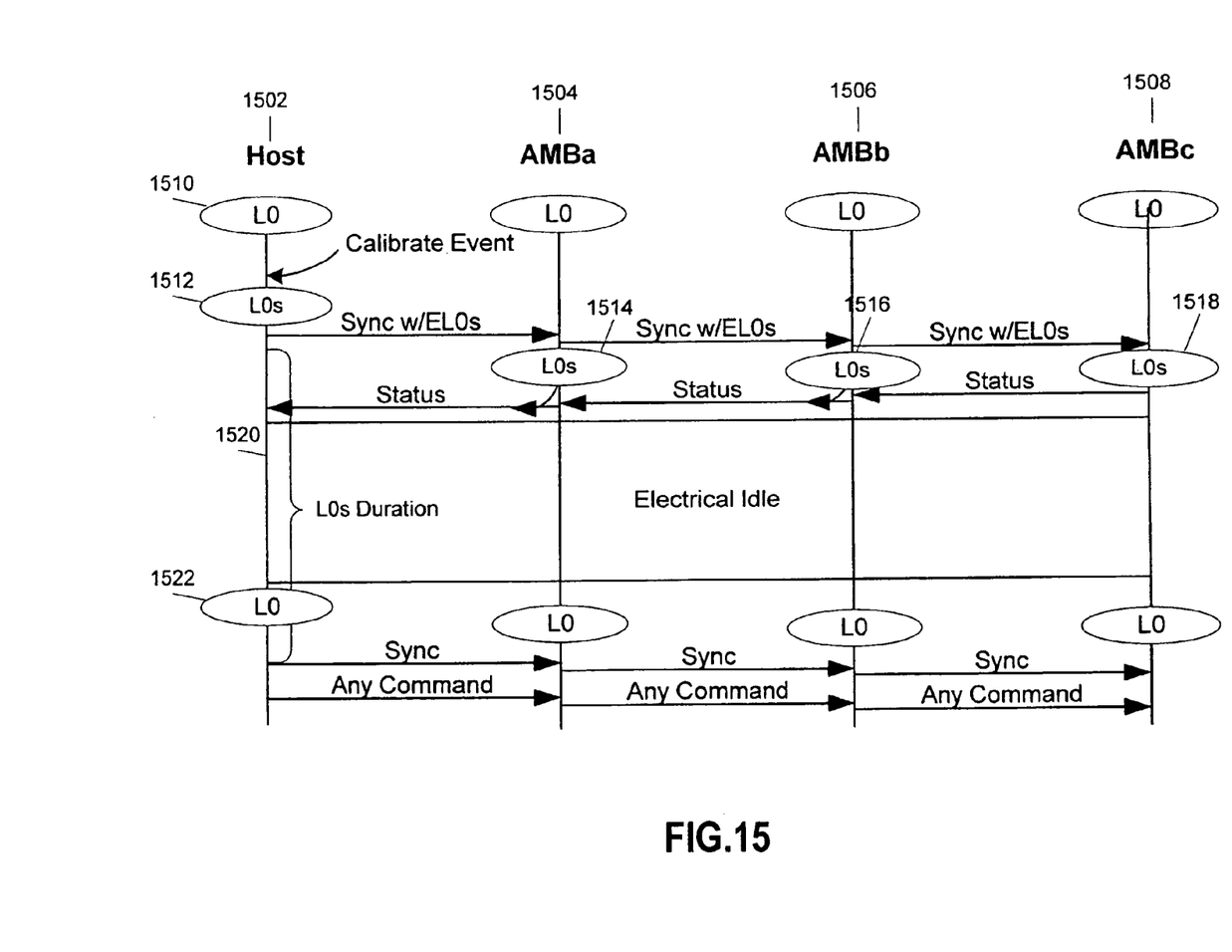
FIG. 15 illustrates an example sequence flow of a power down state between training frames according to an embodiment of the invention.

Referring to FIGS. 14 and 15, the low power state is referred to as the LOs state. During the LOs state the channel may be placed into an Electrical Idle state between training frames. For example, the Tx drive current, and thus power, may be removed in the Electrical Idle state and Tx and Rx circuitry may be powered down. Circuitry in memory buffers on FBDs allows the FBDs to power down in response to the LOs state.

FIG. 14 illustrates a high level initialization flow diagram for a FBD channel. FIG. 14 illustrates an example embodiment as may be applied in a FBD memory system. Referring to FIG. 14, in the disable state 1402, the channel is inactive and the interface signals are in a low power electrical idle condition. At the training state 1404, the initial bit alignment and frame alignment training is done. At the testing state 1406, each bit lane is individually tested. At the polling state 1408, the channel capabilities of individual devices 58 are communicated. The configuration state 1410 allows channel width configuration to be communicated to devices. In the LO state 1412, the channel is active and frames of information flow between the host 50 and devices 58. During the recalibrate state 1414, the channel is momentarily idled to allow Tx and Rx circuits to be recalibrated. And during the LOs state 1418, the channel is in a low-latency power saving condition.

FIG. 15 illustrates a graphical representation of an embodiment during the transition into and out of the LOs state. FIG. 15 depicts components of a memory system including a host 1502, advanced memory buffer (AMB) a 1504, AMBb 1506, and AMBc 1508. The AMBs may be any memory device coupled with the host 1502 that may utilize periodic training frames to implement a power saving state. FIG. 15 show each component initially in a LO state where the channel is active. At 1512, the host signals a transition to the LOs state, for example with a Sync frame with a bit designating entry to an LOs state. The sync frame propagates to each of the AMBs 1504, 1506, and 1508, respectively. In the embodiment depicted in FIG. 15, the AMBs then return and forward a Status frame, respectively, to the host 1502. The channel may maintain an electrical idle state 1520 between training frames, allowing a power down while still maintaining clock recovery from the training frames.

Embodiments do not require a long training period after coming out of a power down state before channel traffic can continue, and therefore result in a very low latency power saving solution. For example, in a channel connected to 667 Mbps DRAM devices the time between training frames is 42*3 ns=126 ns. This power down state can be inserted between memory references without a significant increase in read latency. Other power down solutions require the channel to be retrained. Channel retraining would likely last many microseconds and therefore severely increase the latency of memory read requests. Therefore, embodiments may provide a lower power solution that maintains high system performance.

In an embodiment, a memory system may comprise a memory channel to send training frames to a memory module; a memory module coupled with the memory channel, the memory module to derive a clock from the training frames; and a memory controller connected to the memory channel, the memory module to power down the memory system. The embodiment may power down the memory system between training frames. In an embodiment, the memory channel may be placed in an electrical idle state between training frames. An embodiment may also power down at least one of a transmit and a receive circuitry. The present embodiments may also contain a processor. An embodiment may comprise a mobile computing system with the memory system as described and may further comprise a display to present information or images.

Some embodiments may include a method comprising receiving a training frame at a memory module from a memory channel, the training frame used to derive a clock at the memory module; sending a signal from a memory controller to a memory module, the signal designating entry to a low power state; and powering down the memory channel in response to the signal. The method may further comprise keeping the memory module in a low power state between subsequent training frames. In addition, the method may involve the memory module being kept in a low power state for a specified duration. Also, the method may include the memory channel being placed in an electrical idle state between training frames.

Some embodiments may be provided in a computer program product that may include a machine-readable medium, stored thereon instructions, which may be used to program a computer, or other programmable devices, to perform methods as disclosed above.

The embodiments described herein may be modified in arrangement and detail without departing from the spirit and scope of the present invention. Accordingly, such changes and modifications are considered to fall within the scope of the following claims.

The invention claimed is:

1. A memory module comprising:
   a plurality of memory devices;
   a link to receive training frames from a host;
   circuitry to derive a clock from the training frames, and place the memory module in a low power state between training frames; and
   a timer, the memory module to remain in the low power state for the duration of the timer, wherein the duration of the timer is configured to allow the circuitry to continue deriving a clock from the training frames.

2. A memory module according to claim 1 the circuitry further to place the module in a low power state in response to a signal received on the link.

3. A memory module according to claim 1 the module further comprising at least one of a transmit and a receive circuit such that at least one of the transmit and receive circuits is powered down during the low power state.

4. A mobile computing system comprising:
   a display;
   a memory module including a plurality of memory devices and a link to receive training frames from a host;
   circuitry to derive a clock from the training frames and place the memory module in a low power state; and
   a timer, the memory module to remain in the low power state for the duration of the timer, wherein the duration of the timer is configured to allow the circuitry to continue deriving a clock from the training frames.

5. A mobile computing system according to claim 4 wherein the circuitry is to power down the memory module between training frames.

6. A mobile computing system according to claim 5 wherein the circuitry is further to place the memory module in an electrical idle state between training frames.

7. A mobile computing system according to claim 4 wherein the memory module further comprises at least one of a transmit and a receive circuit to be powered down.

8. A mobile computing system according to claim 4 further comprising a processor.

9. A method comprising:
receiving training frames at a memory module from a memory controller on a memory channel to allow derivation of a clock, the memory module comprising a plurality of memory devices;
sending a signal from the memory controller to the memory module on the memory channel, the signal designating entry to a low power state;
powering down the memory channel in response to the signal; and
keeping the memory module in the low power state for a specified duration, wherein the specified duration is configured to allow continued derivation of the clock from the training frames.

10. A method according to claim 9 further comprising keeping the memory module in a low power state between subsequent training frames.

11. A method according to claim 10 further comprising keeping the memory module in a low power state for a specified duration.

12. A method according to claim 9 further comprising placing the memory channel in an electrical idle state between training frames.

13. A machine-readable medium containing instructions that, when executed, cause a machine to:
receive training frames at a memory module from a memory controller on a memory channel to allow derivation of a clock, the memory module comprising a plurality of memory devices;
send a signal from the memory controller to the memory module on the memory channel, the signal designating entry to a low power state;
power down the memory channel in response to the signal; and
keep the memory module powered down for a specified duration, wherein the specified duration is configured to allow continued derivation of the clock from the training frames.

14. A machine-readable medium according to claim 13 further comprising instructions that, when executed, cause the machine to keep the memory module in a low power state between subsequent training frames.

15. A machine-readable medium according to claim 14, wherein the instructions causing the machine to keep the memory module in a low power state further cause the machine to place the memory module in a low power state for a specified duration.

16. A machine-readable medium according to claim 13 further comprising instructions that, when executed cause the machine to place the memory channel in an electrical idle state between training frames.

17. A memory system, comprising:
a host;
a plurality of memory modules, each of the memory modules comprising:
a plurality of memory devices;
a buffer, wherein the buffer is configured to receive training frames from the host and place the memory module in a low power state; and
a plurality of links connecting the host and the memory modules, wherein each of the buffers on the plurality of memory modules comprises a timer, wherein each of the buffers is further configured to maintain an associated one of the memory modules in the low power state for a duration of the timer, and wherein the duration of the timer is configured to allow the buffer to continue deriving a clock from the training frames.

18. The memory system of claim 17, wherein each of the buffers is further configured to place an associated one of the memory modules in a low power state in response to a signal received on an associated one of the links.

19. The memory system of claim 18, wherein each of the plurality of links comprises:
an inbound link; and
an outbound link.

20. The memory system of claim 19, wherein the plurality of memory modules comprises:
an innermost memory module connected to the host by a first one of the links;
a plurality of interior memory modules, at least one of which is connected to the innermost memory module by a second one of the links; and
an outermost memory module connected to at least one of the interior memory modules by a third one of the links.

21. The memory system of claim 20, wherein the buffer on the innermost module is further configured to receive the signal from the host on the outbound link of the first one of the links and transmit the signal to the interior modules on the outbound link of the second one of the links,
wherein the buffer on the outermost module is further configured to:
receive the signal from the interior memory modules on the outbound link of the third one of the links;
generate a status signal; and
transmit the status signal on the inbound link of the third one of the links, and
wherein the buffer on the innermost module is further configured to receive the status signal from the interior memory modules on the inbound link of the second one of the links and transmit the status signal to the host on the inbound link of the first one of the links.

22. The memory system of claim 19, wherein at least one of the inbound link and the outbound link is powered down during the low power state.

* * * * *